(12) United States Patent
Chu et al.

(10) Patent No.: US 6,427,470 B1
(45) Date of Patent: Aug. 6, 2002

(54) COOLING SYSTEM FOR REDUCING PARTICLES POLLUTION

(75) Inventors: Eric Chu; Kevin Chiang; Ling-Hsin Tseng; Ken Yew, all of Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/776,745

(22) Filed: Feb. 5, 2001

(51) Int. Cl.$^7$ ............................................... F25D 23/12
(52) U.S. Cl. ............................. 62/331; 62/449; 432/77
(58) Field of Search ..................... 62/449, 331; 432/77

(56) References Cited

U.S. PATENT DOCUMENTS 4,249,893 A * 2/1981 Mayers et al. ................. 62/64
4,906,182 A * 3/1990 Moller .......................... 432/77
5,630,322 A * 5/1997 Heilmann et al. ............. 62/63
5,743,729 A * 4/1998 Pavlicevic et al. ............ 62/331

* cited by examiner

Primary Examiner—Ronald Capossela
(74) Attorney, Agent, or Firm—Powell Goldstein Frazer & Murphy LLP

(57) ABSTRACT

The present invention relates to a cooling system of a furnace, more particularly, to a multi-cycle cooling system, located by the furnace door. The probability of pollution by particles can be decreased and the lifetime of the furnace devices can be extended by using different liquid and gas cycles, cooling the different steps the semiconductor processes in the furnace.

33 Claims, 9 Drawing Sheets

|  | Before high temperature process | In the high temperature process | After the high temperature |
|---|---|---|---|
| The first gas cooling cycle | Closing | Opening | Closing |
| The second gas cooling cycle | Closing | Opening | Closing |
| The first liquid cooling cycle | Opening | Closing | Opening |
| The second liquid cooling cycle | Opening | Opening | Opening |

FIG.2C

COOLING SYSTEM FOR REDUCING PARTICLES POLLUTION

BACKGROUND OF THE INVENTION

1. Field of the Invention

The present invention relates to a cooling system of a furnace, more particularly, to a multi-cycle cooling system, located by the furnace door. We can decrease the probability of pollution by particles and extend the lifetime of the furnace devices by using different liquid and gas cycles, cooling the different steps the semiconductor processes in the furnace.

2. Description of the Prior Art

Thermal processing furnaces are used to provide high temperature processing of semiconductor based wafers which are placed within a gas filled processing chamber. Several silicon, silicon based or other types of wafers are typically used in manufacturing semiconductor thermal processing. To avoid the contact of wafers with human hands, the wafers are mechanically inserted into the furnace. In vertical atmospheric diffusion furnaces the wafers are usually inserted into a tower which is on top of a pedestal assembly. The pedestal assembly vertically transports the tower into a tubular shaped chamber of the furnace where the thermal processing occurs. Using a similar principal, horizontal processing furnaces utilize a cantilever assembly which supports wafers therein. The cantilever assembly is transported along a horizontal axis into a horizontally oriented tubular shaped processing chamber. In either type of furnace, it is desired that the wafers be protected from exposure to undesirable gases to ensure proper thermal processing. For example, oxygen, water vapor and particulate found in air can react with the wafers and adversely effect their chemical and physical properties.

In order to ensure the purity of the reactions, the processing chamber of the furnace must be adequately sealed. Therefore, in a thermal processing furnace the interface between the pedestal assembly and processing chamber is designed to prevent reactant gases, from within the processing chamber, from leaking therethrough. Typically, in thermal diffusion furnaces the pedestal assembly is sealed from the tubular processing chamber by an O-ring. Moreover, the tubular processing chamber is usually mounted on a base and is also sealed thereto by an O-ring.

In the present semiconductor processes, the thermal process is generally used in many different kinds of processes like deposition process, oxidation process, and other kinds of processes. Wafers must be heated to a temperature before the thermal process. Therefore, the furnace will still be a tool to be used in the thermal process in the present semiconductor process.

Two types of furnaces are used: One is a horizontal type furnace, and the other is a vertical type furnace. The basic structures of these two types are the same. FIG. 1A shows a structure diagram of the horizontal type furnace. At first, the wafers 10 which need heat treatment are placed on the wafer boat 11, which will be latter transported to the chamber by the paddles 12. The chamber is inside the process tube 13 of the furnace. After the wafer boat 11 arrives at the correct place in the chamber, the door of the furnace 14 must be closed to prevent outside gases and tiny particles from entering into the chamber, not to pollute the wafers 10. The closed door can also prevent the gases leaking out of the chamber from endangering workers when a chemical reaction, such as vapor deposition is taking place in the chamber. In order to make sure the temperatures of the wafers are the same in the chamber, outside the process tube 13, there is a heater 18, which is used to adjust the temperature inside the chamber. This heater is often divided into several parts to adjust each temperature for different regions in the chamber, and also to increase the usability of the furnace.

FIG. 1B shows a cross section diagram of the furnace. The objective of the heat treatment in the furnace is to proceed with semiconductor processes like vapor deposition or thermal oxidation. The reactant is transported through the fluid tube to the chamber by the fluid injector. The pump 19 and the tube 195 extract the by-products that are produced in the reacting process and the remnant reactants after the reaction. The tube 195 connects the process tube 13 and the pump 19.

In order to make the contacting area between the door and the process tube airtight when the door 14 contacts the process tube 13, the furnace uses a flange 17 and an end O-ring 142 on the process tube 13 and near the door 14. The objective of the flange 17 is creating a airtight space after the door 14 closes on the process tube 13. The objective of the end O-ring 142 is to prevent the gas inside the process tube 13 from leaking out.

The flange 17 on the process tube 13 near the door 14 is used to make the process tube 13 connect hermetically with the door, and to make sure that the process tube is an airtight place. Therefore, the end O-ring 142 must be assembled in the flange 17 to prevent the gas escaping out of the chamber from affecting the process in the process tube 13. When the process temperature is higher, the materials of the end O-ring 142 lose their elasticity and will not have enough ability to seal up the crevice between the door 14 and the process tube 13. Therefore, the flange 17 on the process tube 13 near the door 14 includes a cooling system to protect the end O-ring 142. Especially in the high temperature processes inside the process tube 13, cooling systems having higher efficiencies to extend the lifetime of the end O-ring are needed.

FIG. 1C shows part of a cross section diagram of the furnace. Traditional flange 17 comprises the first flange 181, the second flange 182, the flange O-ring 183, the end O-ring 142, and the cooling system 184 which is located in the first flange 181 and the second flange 182. This cooling system is a single cycle system. The cooling liquid flows into the second flange 182 and flows out of the first flange 181 after the cycle. Obviously, the liquid cooling cycle is used for cooling and protecting the flange O-ring 183 and the end O-ring not to lose their capabilities in the high temperature process. In the traditional flange cooling system, the cooling liquid is usually used in water. The boiling point of the water is about 100° C., therefore the temperature of the place near the flange will be limited in the cooling liquid which flows in the cooling system and the temperature of the place near the flange will not be raised at will. In other words, the temperature of the place near the flange is lower than others places on the process tube.

In the semiconductor process like the deposition process or the thermal oxidation process, the gas in the process tube usually proceed in the chemical reaction and produce some by-products in the reaction process. Following the property of the by-product is different, the critical temperature which divides by-products into the vapor phase and the solid phase is different. When the condition of the temperature is higher, the probability of the by-products becoming to the vapor phase is higher. When the conditions of the temperature is lower, the by-products become to the solid phase easier. The solid phase by-products deposit easily on the place around inside the process tube to affect the qualities of the wafer in the process.

In general, the pump 19 that is on the back-end of the process tube 13 is used to extract the by-products, which are produced in the semiconductor process, from the process tube 13, but the by-products cannot be extracted from the process tube 13 absolutely. Sometimes, the remainder by-products in the process tube 13 are in the vapor phase, but sometimes the remainder by-products are usually in the solid phase depositing at the lower temperature place around inside the process tube. Furthermore, because we use pump 19 to extract the by-products from the process tube 13, the solid phase by-products may be brought to the pump 19 or the tube 195 which connects the pump 19 and the process tube 13 by running pump 19 to cause the process problems. Obviously, it may be found that the vapor phase by-products are extracted by pump 19 continuously and not cause some serious problems. It may also be found that the solid phase by-products not only deposit on the wafers but also deposit on the pump 19 and the tube 195 which connects process tube 13 and the pump 19. This situation makes wafers 10 which complete the process to be scraps and decreases the efficiency in extracting the by-products from the process tube 13 by the pump 19. Therefore, the solid phase by-products are the pollution sources which are not ignored in the furnace proceeding semiconductor process.

For example, when a low pressure chemical vapor deposition process is performed to form silicon nitride, $NH_4$ and $SiCl_2H_2$ (DCS) reciprocally interacts under 800° C. and 150 mill torrs environment. Herein, the ratio of $NH_4$ to $SiCl2H_2$ is about 3:1 and attendant by-product is $NH_4Cl$. Further, because gas-like $NH_4Cl$ is solidified when temperature is less than 150° C., it is possible that white particles of $NH_4Cl$ are formed in chamber terminal. If the liquid cooling system which is using water, $NH_4Cl$ will become from vapor phase to solid phase white particles and deposit on the door 14 terminal in the process tube 14. Because the boiling point of the water is 100° C., and this temperature is lower than the temperature in $NH_4Cl$ becoming from vapor phase to solid phase white particles. The deposited particles will pollute the wafers 10 which are in the process tube 13 and the tubes which connect to the process tube 13 by the pump 13 extracting continuously. The pump 13 is on the end terminal of 13.

In the foregoing discussions about furnace, it may be found that when the furnaceis used, a cooling system must be used in the flange to protect the end O-ring and the flange O-ring, therefore the solid phase particles deposit around the flange easily. The solid phase particles will pollute the wafers to become the scraps after proceeding the process or affect the proceeding of the pump, even decrease the lifetime of the pump. Therefore, the structure of the furnace must be changed to decrease the possibility of forming the solid phase particles. The present invention is especially in changing the cooling system of the flange.

SUMMARY OF THE INVENTION

With this as background, the solid phase by-products create a lot of problems in the furnace process in using traditional cooling system. The major objective of the invention is to decrease the probability in particle pollution in the furnace, especially to decrease the particle pollution which is came from the solid phase by-products in the process tube in the semiconductor process.

The second objective of this invention is to decrease the probability in the solid phase by-products depositing around the cooling system of flange to decrease the bad rate of the wafers after thermal process.

The third objective of this invention is to provide a cooling system in the flange. This cooling system can be used in different range of the temperature to reach the cooling function and can decrease the probability in forming the particles.

The forth objective of this invention is to decrease the temperature of the end O-ring and the flange O-ring in the proceeding process effectively by using the cooling system in the flange to extend the lifetime of the end O-ring and the flange O-ring.

The fifth objective of this invention is to decrease the probability in forming solid phase by-products by using the multi-cycle cooling system in the flange to decrease the cost of the production.

It is a further objective of this invention to decrease the probability in forming solid phase by-products by using the multi-cycle cooling system in the flange to increase the cycle time in the process. This situation also can decrease the times in cleaning furnace and increase the efficiency in the proceeding process.

According to the foregoing objectives, the present invention provides a multi-cycle cooling system to make the temperature of the place around the end O-ring and the flange O-ring higher than the critical temperature which divides by-product into the vapor phase and the solid phase to decrease the probability in forming solid phase by-products. This situation makes the wafers which are proceeding process not to be polluted by solid phase by-products depositing on the surface of the wafers to increase the probability in producing scraps. This multi-cycle cooling system can protect the end O-ring and the flange O-ring not to be damaged from the high temperature to extend the lifetime of the end O-ring and the flange O-ring. This multi-cycle cooling system also can increase the cycle time of the proceeding process and decrease the times in cleaning the furnace. This multi-cycle cooling system further can increase the efficiency of the process and decrease the cost of the production.

BRIEF DESCRIPTION OF THE DRAWINGS

In the accompanying drawing forming a material part of this description, there is shown:

FIG. 2C shows the basic operating theorems in the cooling system which is provided from the present invention.

DESCRIPTION OF THE PREFERRED EMBODIMENT

Figure 1A:
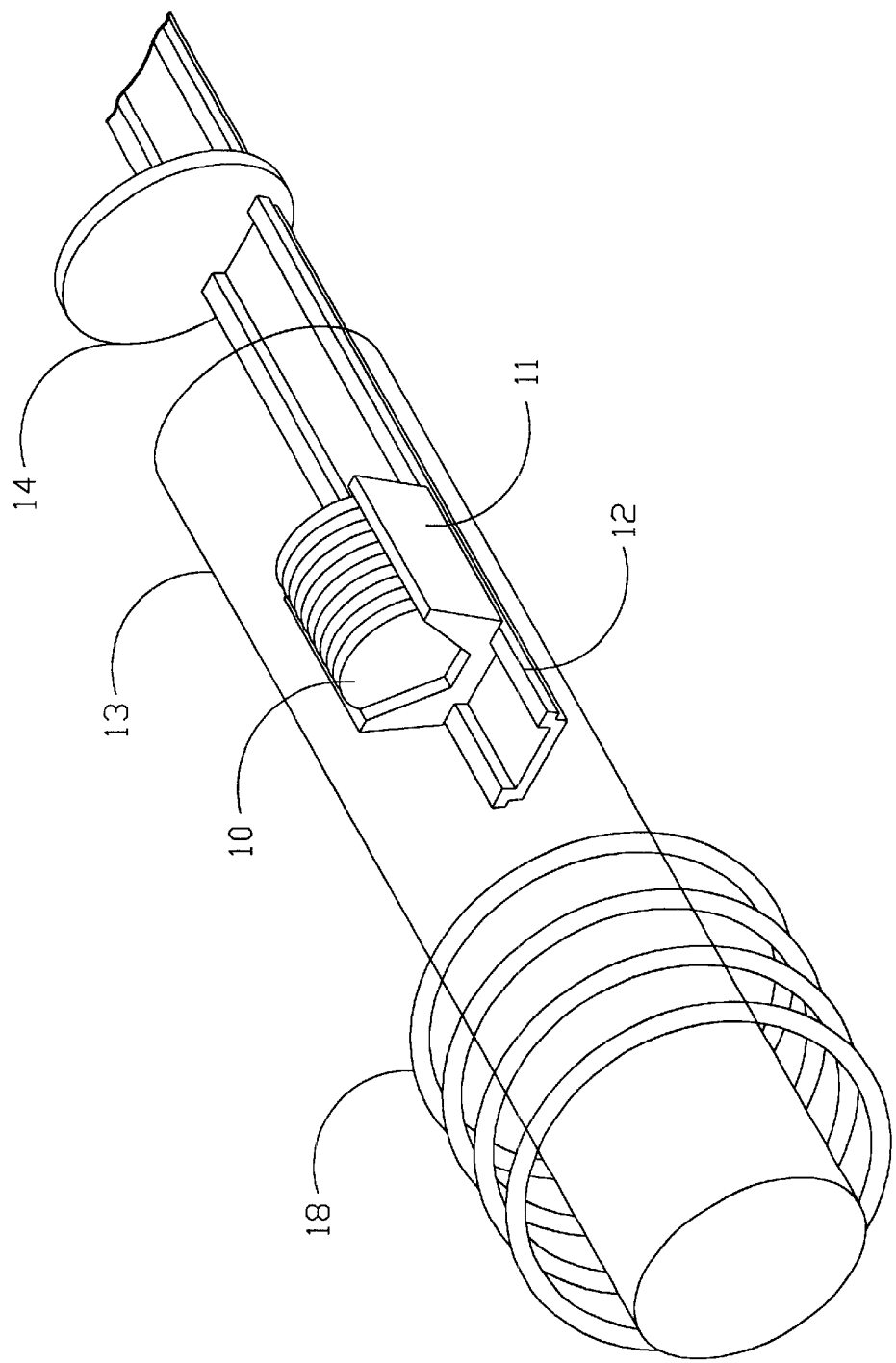
FIG. 1A shows a structure diagram of the horizontal type furnace.
Figure 1B:
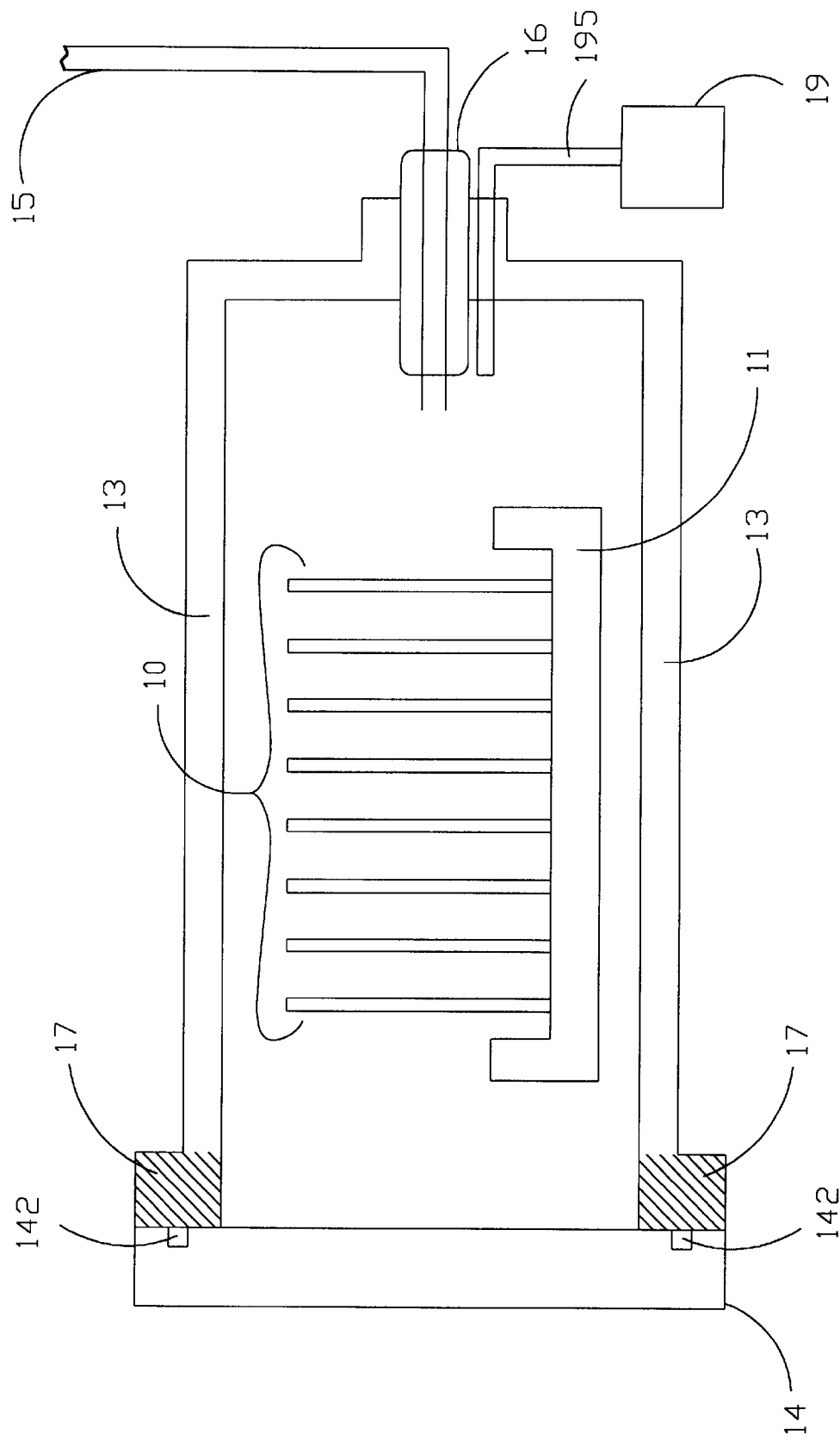
FIG. 1B shows a cross section diagram of the furnace.
Figure 1C:
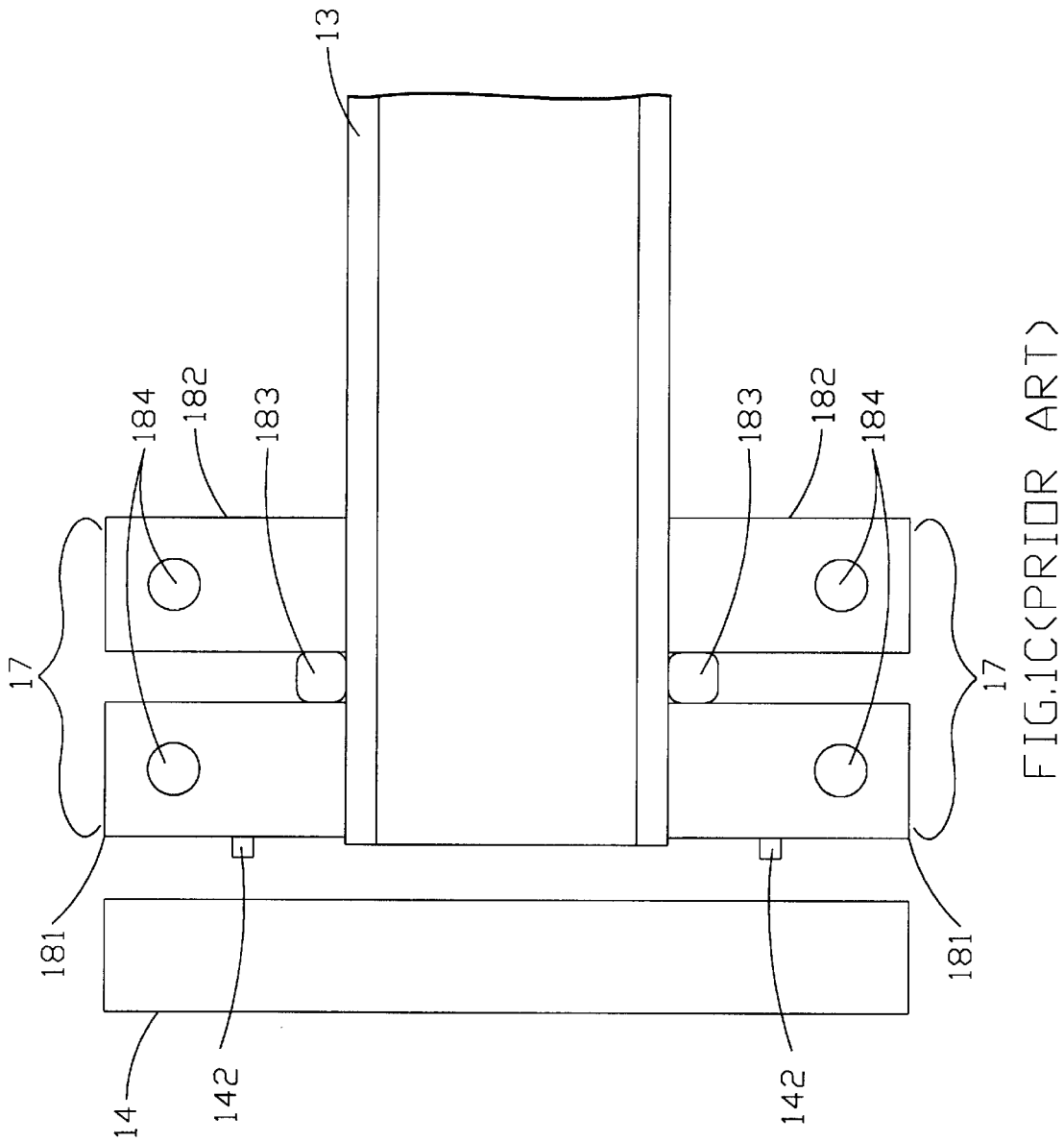
FIG. 1C shows part of a cross section diagram which comprises the process tube, the flange, the door, and the cooling system on the furnace.

The foregoing aspects and many of the attendant advantages of this invention will become more readily appreciated as the same becomes better understood by reference to the following detailed description, when taken in conjunction with the accompanying drawings, wherein:

In the traditional furnace process, the by-products which are formed by reaction vapor become solid phase particles when the environment temperature is lower than the critical temperature which divides by-products into vapor phase and solid phase. These solid phase by-products usually bring a lot of problems in the process. In the traditional furnace equipment, we usually assemble a single cycle cooling system in the flange to protect the end O-ring and the flange O-ring. The function of the end O-ring and the flange O-ring is to keep a airtight space in the process tube. Water is usually used to be the cooling liquid in the cooling system. The water flow into the second flange and flow out of the first flange to decrease the temperature of the place around the flange and to prevent the end O-ring and the flange O-ring to be damaged in over high temperature to increase, the cost of the production. But the boiling point of the water is 100° C., we just keep the temperature of the place around the flange about 100° C. and raise the temperature hardly. This temperature is almost lower than the critical temperature which divides by-products into vapor phase and solid phase. Therefore, the solid phase by-products are easier formed at the place around the flange and affect the wafers which are in the proceeding process.

Generally, if a single cycle cooling system is used in discontinuously providing the circular cooling water or controlling the flow rate in the circular cooling water, the problems from solid phase by-products can be solved. When the circular cooling water or bigger amount of the flow rate in the circular cooling water are provided, the temperature at the place around the flange is lower than the critical temperature which divides by-products into vapor phase and solid phase and easily form solid phase by-product particles. When provisions for the circular cooling water or a smaller amount of the flow rate in the circular cooling water are made, the temperature at the place around the flange is raised suddenly and is higher than the critical temperature which divides by-products into vapor phase and solid phase. This condition makes the solid phase by-product particles, which are formed when the circular cooling water is provided or the amount of circular cooling water is bigger, to become the vapor phase by-product following the temperature to be raised and not to affect the wafers which is in the proceeding process. However, the interrupted time in the circular cooling water and the amount of the flow rate in the circular cooling water are not easily controlled in exactly. The breakdown probability in pump which is used for providing the discontinuous circular cooling water is also higher. Then it is found that the end O-ring and the flange O-ring are usually damaged when the pump is breakdown. This condition will increase the cost of the production.

The lifetime of the O-ring is an inverse proportion to the temperature of the environment. When the temperature of the environment in using the O-ring is higher and higher, the lifetime of the O-ring is shorter and shorter. On the other hand, when the temperature of the environment in using the O-ring is lower and lower, the lifetime of the O-ring is longer and longer. But in the furnace process, when the environment temperature of the flange is lower and lower, the solid phase by-products are easier and easier to deposit at the place near the flange in the process tube. When the environment temperature of the flange is higher and higher, the probability of depositing the solid phase by-products at the place near the flange is lower. However, this condition will decrease the lifetime of the O-ring. The present invention provides a multi-cycle cooling system to decrease the probability of depositing the solid phase by-product particles at the place near the flange and to extend the lifetime of the O-ring as far as possible in the high temperature environment for short time by using different cooling system in different proceeding ways in the process. The present invention also can increase the probability of the proceeding process.

The useful life of the O-ring is an inverse proportion to the temperature of the using environment. When the temperature of the using environment is higher and higher, the using life of the O-ring is shorter and shorter. When the temperature of the using environment is lower and lower, the using life of the O-ring is longer and longer. But in the furnace process, when the temperature of the O-ring environment is lower and lower, the solid by-products will be more and more easily deposited in the chamber. When the temperature of the O-ring environment is higher and higher, the solid by-products will not be deposited. However, the using life of the O-ring will be reduced. The present invention uses the multi-cycle cooling system to use different cooling system in the different proceeding ways in the process. This condition will make the O-ring in the high temperature environment at the short time to decrease the probability in depositing the by-products which are near the O-ring and to extend the using life of the O-ring as far as possible. This condition can further increase the efficiency of the process.

Figure 2A:
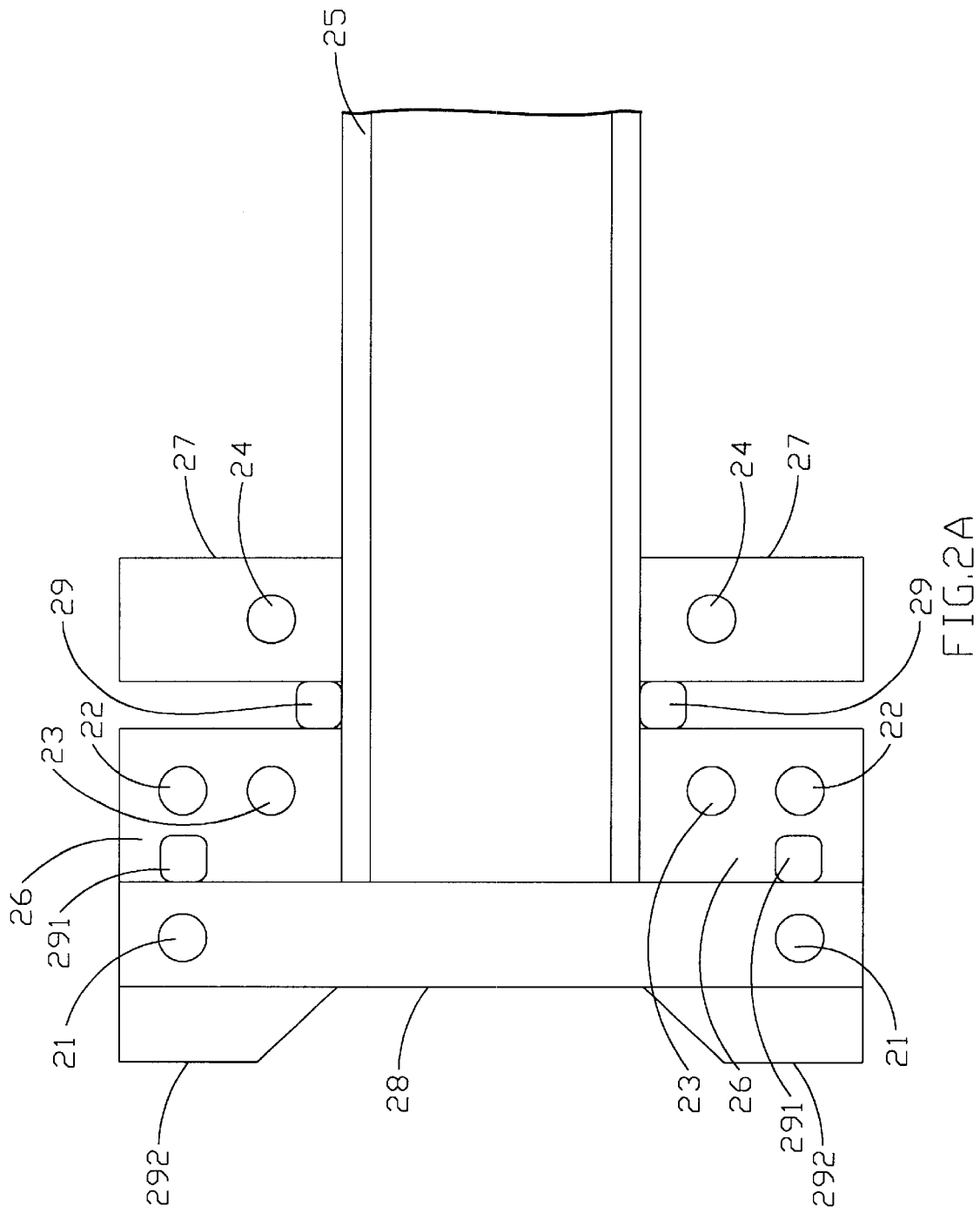
FIG. 2A shows a cross section diagram which comprises the process tube, the flange, the door, and the cooling system to be composed in the present invention.

FIG. 2A shows a cross section diagram which comprises the process tube, the flange, the door, and the cooling system to be composed in the present invention. This embodiment of the present invention is a cooling system used for cooling the place near the door terminal on the process tube. The present invention in this embodiment comprises: a door 28, a process tube 25, heat sinks 292, the first flange 26, the second flange 27, and a flange O-ring 29. The first flange 26 and the second flange 27 are at the place near the door 28 terminal on the process tube 25. The heat sinks 292 are on the door 28 to increase the thermal dissipating probability of the door 28. The flange O-ring 29 is at the place between the first flange and the second flange to seal the vacant space which is between the first flange and the second flange. The door 28 comprises the first gas cooling cycle 21. The first flange comprises the second gas cooling cycle 22 and the first liquid cooling cycle 23. The second flange comprises the second liquid cooling cycle 24.

Figure 2B:
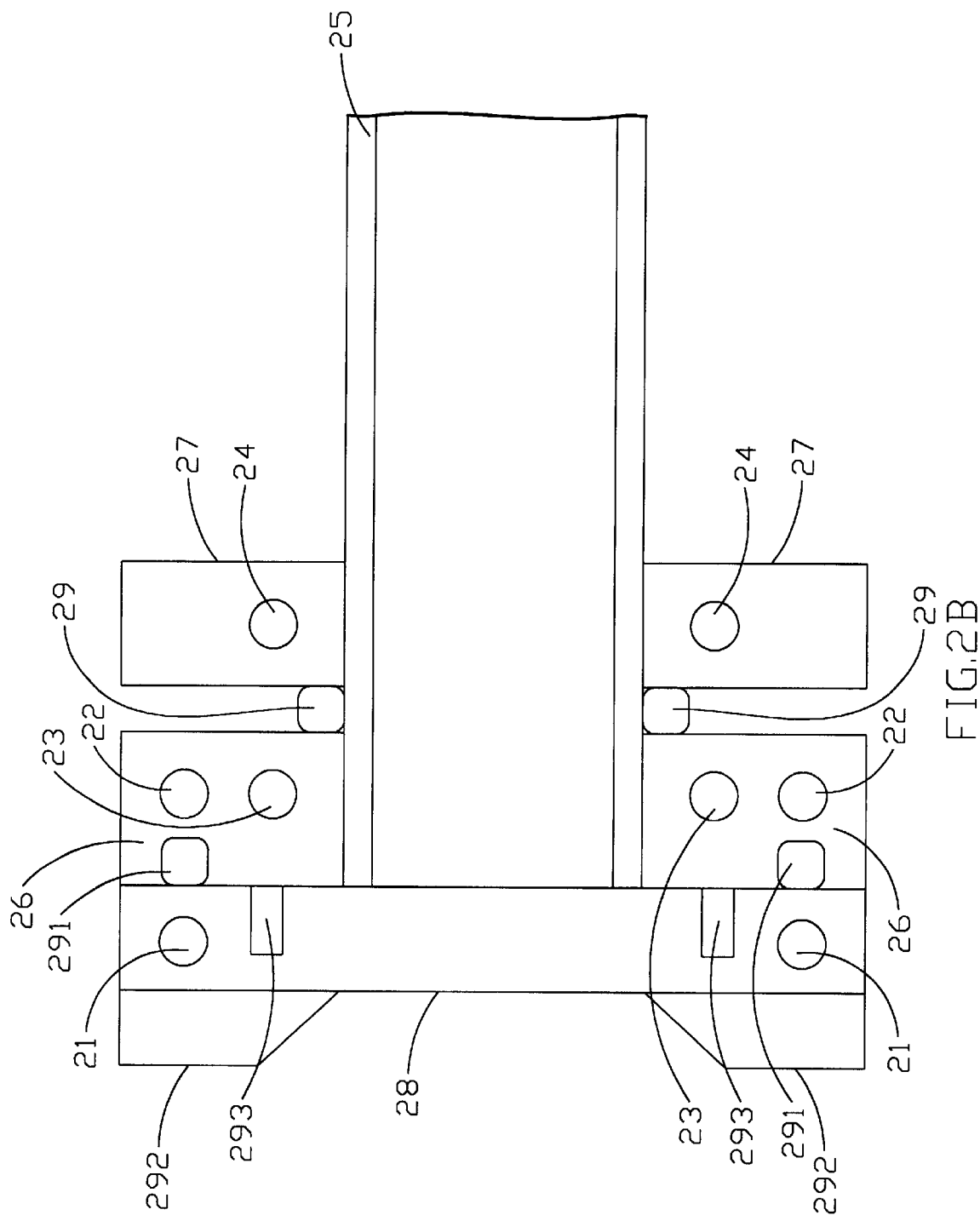
FIG. 2B shows a cross section diagram which comprises the process tube, the flange, the door, and the cooling system to be composed in another form of the present invention.

FIG. 2B shows a cross section diagram which comprises the process tube, the flange, the door, and the cooling system to be composed in another form of the present invention. In order to decrease the probability of, inside the process tube 25 being polluted with outside environment like reactant leakage or outside impurities entering to inside the process tube 25, we can assemble a end O-ring 291 at the place on the side of the first flange 26 near the door 28 to seal the vacant space when the door 28 and the first flange 26 are combined in hermetically. In order to extend the lifetime of the end O-ring, a heat insulation slot 293 may be defined on the door 28 near the side of the end O-ring 291 to decrease the thermal energy being conducted from the door 28 to the end O-ring 291.

It is clear that the difference between this embodiment of the present invention and the traditional technology is using the gas cooling cycle and the liquid cooling cycle at the same time in the present invention. The traditional technology only use liquid cooling cycle, which is limited in the boiling point of the liquid, not to raise the temperature at will. The gas which is used in the gas cooling cycle not has this limit.

The first gas cooling cycle 21 is located in the door 28 and is opened when inside the process tube is proceeding the high temperature process like the depositing process. In other words, the first gas cooling cycle just proceeds in cooling function when inside the process tube is proceeding the high temperature process. Furthermore, the gas flowing in the first gas cooling cycle is like the high pressure air or the dry and cold air. The high temperature process generally means that the reaction temperature in the semiconductor process is higher than 800° C. The reactant that is used for forming the silicon nitride in the high temperature process comprise $NH_3$ and $SiCl_2H_2$.

The second gas cooling cycle 22 and the first liquid cooling cycle 23 are located in the first flange 26. The second gas cooling cycle 22 is just opened when inside the process tube is proceeding the high temperature process. The first liquid cooling cycle 23 is just closed when inside the process tube 25 is proceeding the high temperature process. In other words, the first liquid cooling cycle 23 is used for cooling the flange in the low temperature process and the second gas cooling cycle 22 is used for cooling the flange in the low temperature process. The gas flowing in the second gas cooling cycle 22 is like the high pressure cold gas, the nitrogen, or the inert gas. The liquid flowing in the first liquid cooling cycle 23 is the refrigerant or the water. We usually use the water to be the cooling liquid in the first liquid cooling cycle 23. Furthermore, the second gas cooling cycle 22 and the first gas cooling cycle 21 can use the same gas source or different gas sources.

The second liquid cooling cycle 24 is in the second flange 27. The second liquid cooling cycle 24 and the first liquid cooling cycle 23 are the independent systems to each other. The liquid sources in the second liquid cooling cycle 24 and the first liquid cooling cycle 23 are different. The second liquid cooling cycle 24 is always opened no matter inside the process tube 25 proceeding the high temperature process or not. The liquid flowing in the second liquid cooling cycle 24 is the refrigerant or the water. The water is usually saved to be the cooling liquid in the second liquid cooling cycle 24.

Before the functions of the present invention are further explained, it must be emphasize that the wafers must be tested, adjusted, and prepared after the wafers to be placed in the process tube in the real furnace process at first. These steps are like judging the locations of the wafers to be right or not, cleaning the wafers, or extracting a vacuum situation in the process tube. After these steps, the different semiconductor processes are proceeded with, like transporting reactions, heating, and depositing. After these processes, the temperature inside the process tube is dropped and the vacuum inside the process tube is broken. Finally, the wafers are removed from the process tube. The process tube only must be heated at the high temperature when inside the process tube is proceeding the vapor depositing high temperature process. The process tube not has to be heated at the high temperature in others processes. In other words, the elements on the process tube just need to be protected by cooling system when the process tube is proceeding the high temperature process. These elements are like the end O-ring or the flange O-ring.

The basic rules in this embodiment can be found from FIG. 2C. Here it is illustrated that the process tube proceeds the high temperature process, and only then are opened the first liquid cooling cycle 23 and the second cooling cycle 24 to proceed the cooling function. When inside the process tube 25 is proceeding the high temperature process, only the first liquid cooling cycle 23 is not opened to proceed the cooling function. After inside the process tube 25 proceeds the high temperature process, we still open the first liquid cooling cycle 23 and the second cooling cycle 24.

The furnace is a device which need to be heated at the high temperature, but the heating rate of the furnace is slow. Therefore, when the furnace not proceeds the high temperature process, the furnace must be kept at the certain temperature to increase the efficiency of the proceeding process. When inside the process tube not proceeds the high temperature, the temperature inside the process tube is about 400° C. If the cooling system is not assembled to protect the end O-ring 291 and the flange O-ring 29, which keep inside the process tube to be a airtight space, the lifetime of the end O-ring 291 and the flange O-ring 29 will be decreased in this temperature environment. Therefore in the present invention, when inside the process tube not proceeds the high temperature, the first liquid cooling cycle 23 and the second liquid cooling cycle 24 are opened to decrease the temperature of the end O-ring 291 and the flange O-ring 29. When inside the process tube not proceeds the high temperature, there is not any reaction gas in the process tube. Therefore, when liquid is used to proceed cooling function, we do not have the problems about producing solid phase by-products.

When the wafers are placed in the process tube and import the reaction gas to inside the process tube to proceed the high temperature process, the first liquid cooling cycle 23 is closed instantly and the first gas cooling cycle 21 and the second gas cooling cycle 22 are opened at once. When inside the process tube proceeds the high temperature process, the higher temperature place in the process tube is the place which is placed the wafers. The temperature is decreased following the increased length between the place and the wafers. The length between the first liquid cooling cycle 23 and the high temperature place is longer than the length between the second liquid cooling cycle 24 and the high temperature place. Therefore, the temperature at the place near the first liquid cooling cycle 23 is lower. When inside the process tube is proceeding the high temperature process, the reaction gas in the process tube will proceed the chemical reaction process and will form the byproducts. The by-products are following the decreasing environment temperature to increase the probability of forming the solid phase byproducts particles. Therefore, the first liquid cooling cycle 23 must be closed to prevent forming the solid phase by-products particles, which can affect the wafers in the proceeding process, at the place near the first liquid cooling cycle 23. If the cooling system is not used, the end O-ring 291 and the flange O-ring 29, which are used for making the process tube to be a airtight space, will be damaged at the over high temperature. Therefore, the first gas cooling cycle 21 and the second gas cooling cycle 22 are must opened at once to decrease the temperature of the end O-ring 291 and the flange O-ring 29. The condition that the first gas cooling cycle 21 and the second gas cooling cycle 22 are opened not only protects the end O-ring 291 and the flange O-ring 29, but also increase the temperature at the place near the door 28 in the process tube 25 to the standard that the solid phase particles are not easily formed by the gas cooling cycle. There will be no problems in raising the temperature hardly like using liquid cooling cycle and being limited in the boiling point of the liquid. The cooling efficiency in using the gas cooling cycle is lower than using the liquid cooling cycle. But using the gas cooling cycle can make the by-products that are formed from the reaction gas in the process tube to keep the vapor phase state. This condition can not produce solid phase by-products particles in the over low temperature process to affect the qualities of the wafers in the proceeding process.

Furthermore, the heat insulation slot 293, which can decrease the heat conduction area, is on the door 28 to decrease the heat conducting from the center to the side of the door near the end O-ring and to extend the lifetime of the end O-ring 291. Several pieces of the heat sinks 292 on the door 28 are assembled to increase the heat conduction efficiency of the door. These heat sinks can avoid the temperature of the door too high to conduct the heat to the end O-ring and can extend the lifetime of the end O-ring 291.

Generally speaking, the lifetime of the end O-ring 291 and the flange O-ring 29, which are used for making a airtight space in the process tube 25, are immovable. The end O-ring 291 and the flange O-ring 29 are damaged easily in the high temperature environment for a long time. Therefore, when inside the process tube not proceeds the high temperature process, we use the first liquid cooling cycle 23 and the second liquid cooling cycle 24. When inside the process tube 25 is proceeding the high temperature process, we use the first gas cooling cycle 23, the second gas cooling cycle 24, and the second liquid cooling cycle 22. The objective of this way is to avoid that the end O-ring 291 and the flange O-ring 29 are in the high temperature environment for a long time to decrease the lifetime. This way also can prevent the solid phase by-products particles to be formed.

In order to increase the cooling efficiency of the door 28, the third liquid cooling cycle (not showing in the diagram) in the door 28 can be added and cooperate with the second gas cooling cycle 22 in the proceeding process. The third liquid cooling cycle can increase the cooling efficiency of the door 28 and to extend the lifetime of the end O-ring 291. Furthermore, the third liquid cooling cycle can also avoid the solid by-products to be formed. When inside the process tube 25 is proceeding the high temperature process, the third liquid cooling cycle is closed and the second gas cooling cycle 22 is opened to proceed with the cooling process. When inside the process tube 25 not proceeds the high temperature process, the second gas cooling cycle 22 is closed and the third liquid cooling cycle is opened to proceed the cooling process. The third liquid cooling cycle, the second liquid cooling cycle, and the first liquid cooling cycle are the independent systems to each other. The liquids flowing in the third liquid cooling cycle, the second liquid cooling cycle, and the first liquid cooling cycle are the refrigerant or the water.

Figure 3A:
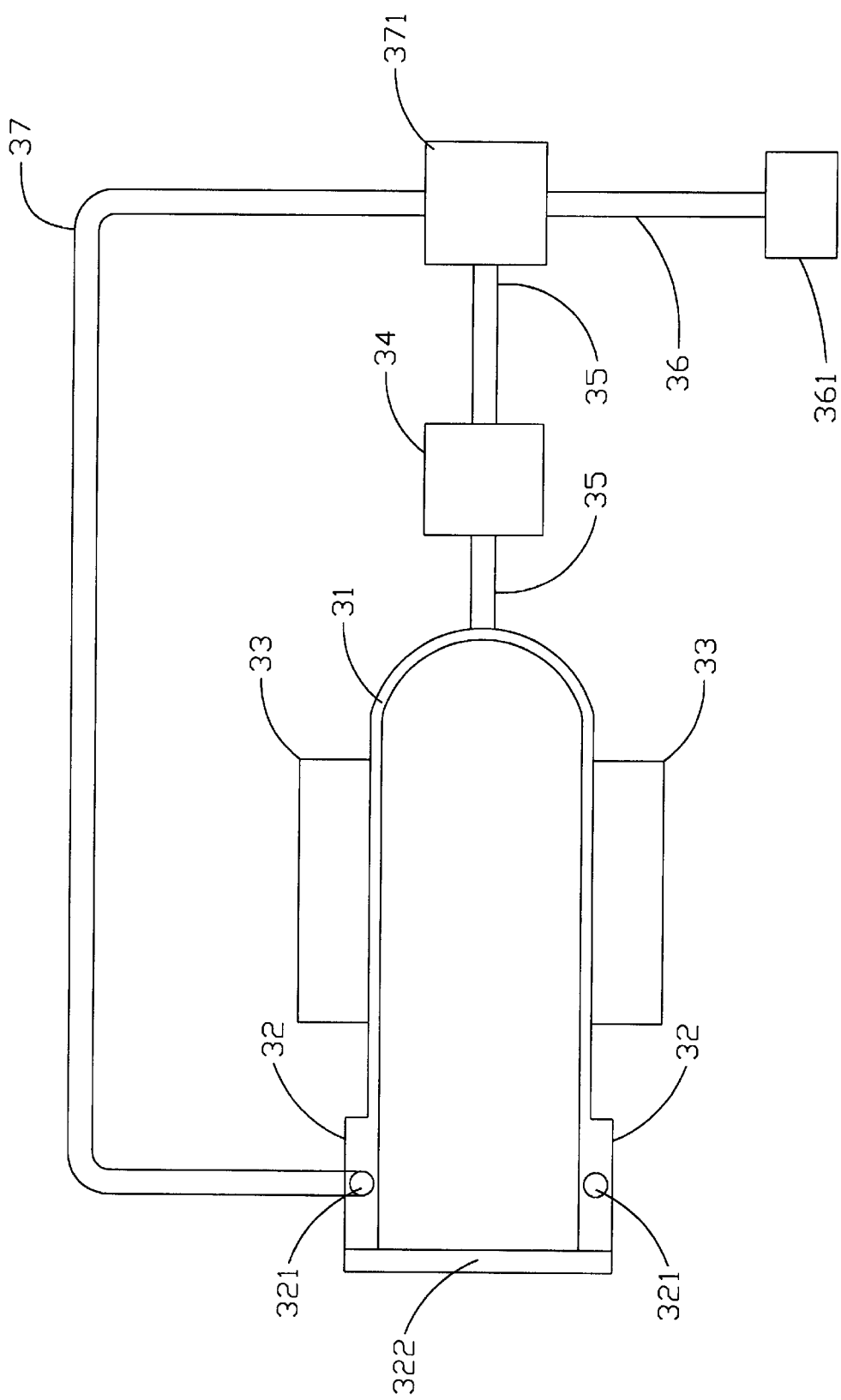
FIGS. 3A to 3C shows the structural diagram in another embodiment of the present invention.

FIG. 3A shows the structural diagram in another furnace system of the present invention. The furnace system comprises: a process tube 31, a flange 32, a heater 33, a pump 34, the first tube 35, the second tube 36, and the third tube 37.

The process tube 31 is used for proceeding a semiconductor process. The reaction gas is usually formed the solid phase particles in the lower temperature environment in the semiconductor process to affect the qualities of the wafers which is proceeding the process. The flange 32 is on the process tube 31 near the door terminal and inside the flange comprises a gas cooling cycle 321. The gas cooling cycle 321 also can be assembled in the flange 32 and the door 322 at the same time. The cooling system, which is used for cooling the flange 32, comprises a gas cooling cycle 321 and a liquid cooling cycle. The cooling system is similar to the cooling system which is described in the above embodiment. Furthermore, the heater 33 is on the outside around the process tube 31 to provide the heat to the process tube 31 which proceeds the semiconductor process. The pump 34 is used for extracting the remainder reaction gas and the by-products from the process tube 31 after the semiconductor process. The first tube 35 is used for connecting the process tube 31 and the pump 34. The second tube 36 is used for connecting the pump 34 and the means for treatment 361. The means for treatment is used for treating the reaction gas, cooling gas, and the by-products. The third tube 37 is used for transmitting the gas, which is discharged from the gas cooling cycle 321, to the second tube 36 passing through the venturi 371. Then the gas enter to the means for treatment to be treated.

After comparing the embodiment and the traditional furnace, two outstanding characteristics can be found. The first, use the gas cooling circle 321 in the cooling system is always used in the flange and the liquid cooling cycle in the flange is used in the traditional technology. Therefore, the embodiment can avoid the temperature at the place near the flange to be limited in the boiling point of the liquid, which is used in the liquid cooling cycle, lower than the critical temperature, which divides by-products into the vapor phase and the solid phase, and decrease the defects in forming solid phase by-products particles. The embodiment furthermore can decrease the probability of forming the solid phase particles at the place near the flange effectively. The second, the embodiment make the gas, which is discharged from the gas cooling cycle 321, transmitting to the second tube 36 passing through the third tube 37 and the venturi 371. The gas can obviously raise the efficiency of the pump and dilute the waste gas which is discharged by the pump 34. The gas furthermore can raise the temperature of the waste gas. In other words, we can decrease the probability of making the by-products to be transformed the solid phase particles in the furnace.

Figure 3B:
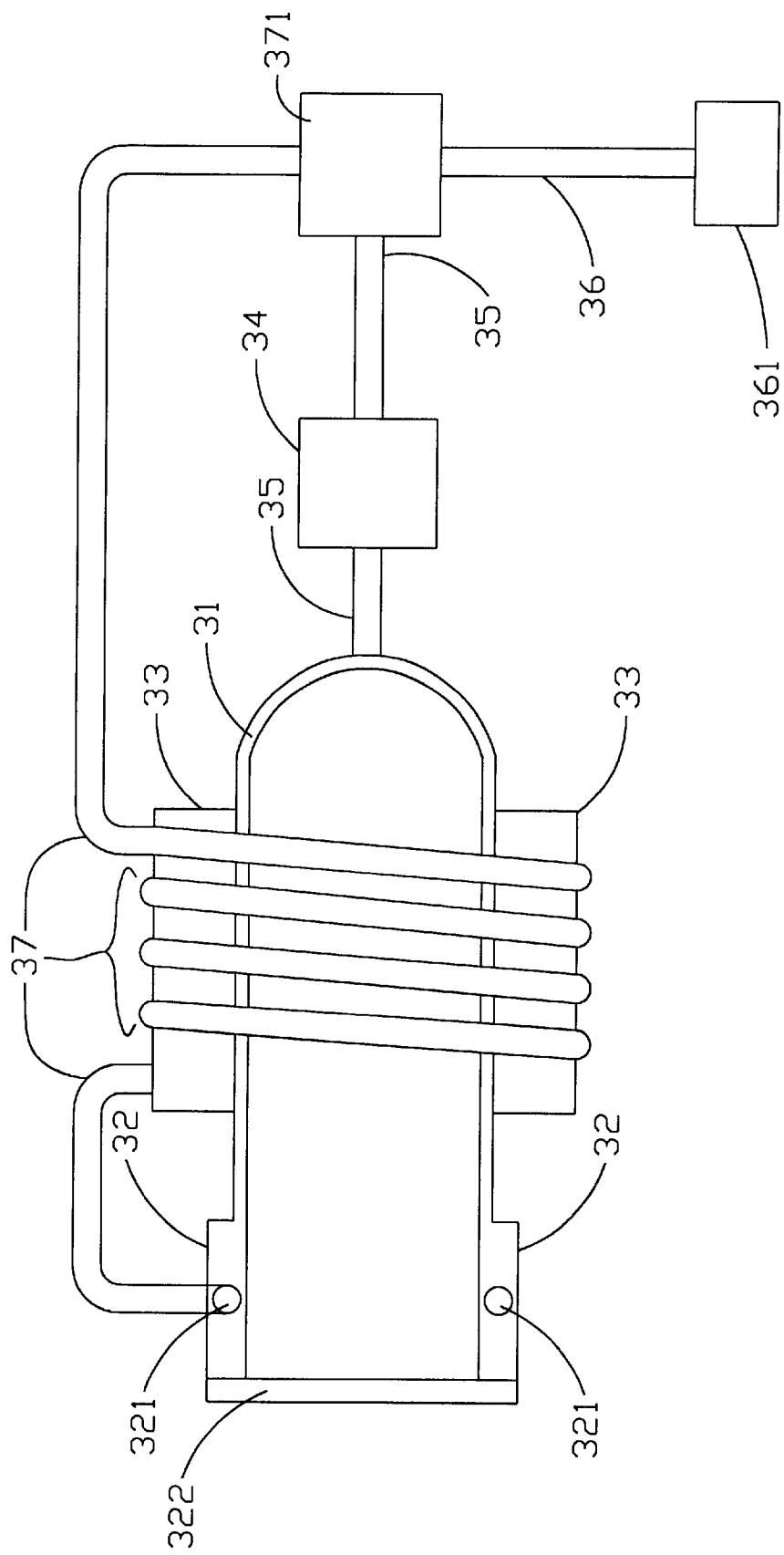
Figure 3C:
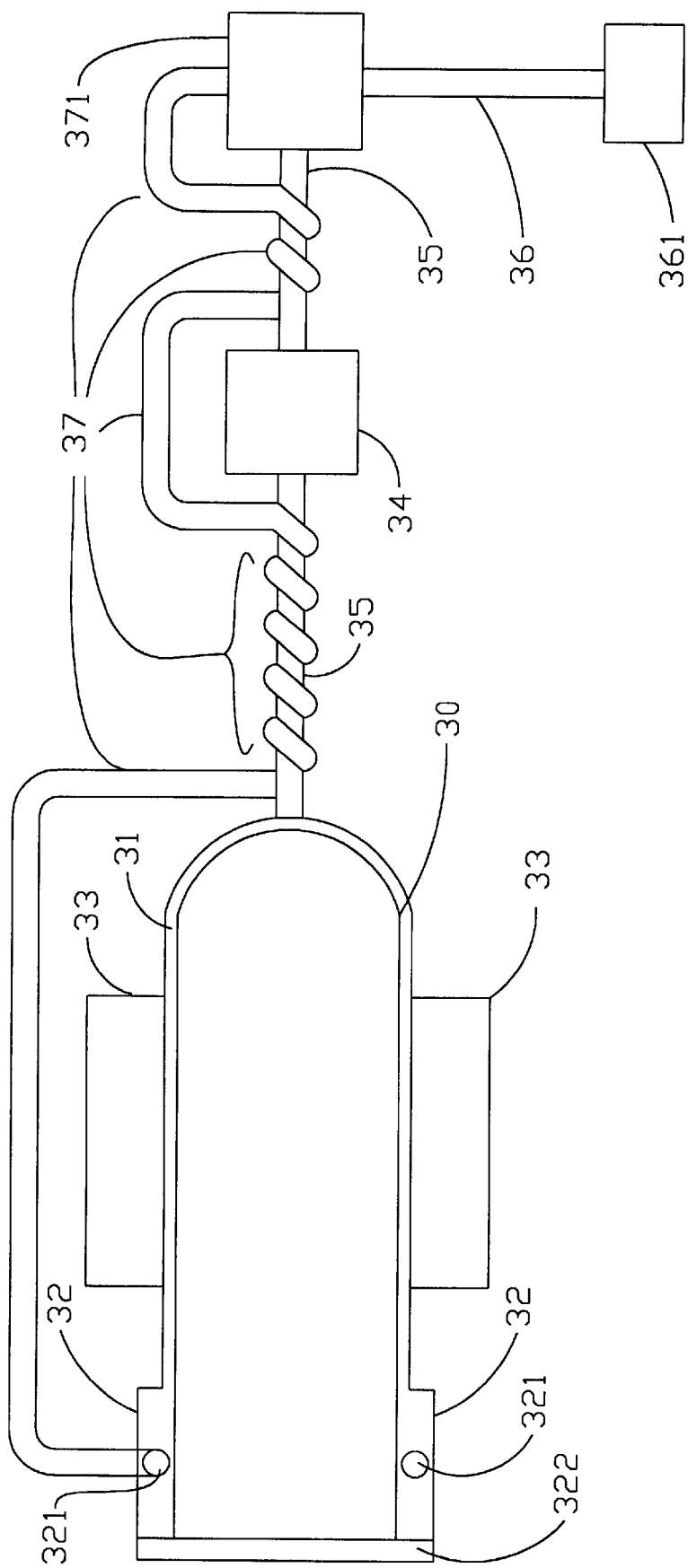

Referring to FIG. 3B, in order to decrease the probability of making by-products to transform the solid phase particles in the first tube and forming the solid phase particles due to the temperature to be lower, the embodiment can raise the temperature of the gas in the third tube 37 by using the third tube 37 surrounding to the heater 33 and then connecting to the venturi 371. Referring to FIG. 3C, the embodiment also can raise the temperature of the gas in the first tube 35 by using the third tube 37 surrounding to the first tube 35 and then connecting to the venturi 371. The embodiment can also contain the two kinds of improved methods.

In the traditional technologies, the methods for preventing the solid phase particles to be formed in the first tube 35 and the second tube 36 is to shorten the length of each tube, to decrease the possibility of the curves appearing on the tubes by changing the shape of each tube, or to assemble the particles trap devices in each tube. But there are too many conditions in disposing the furnace system to prevent the particles to be formed by adjusting the length and the shape of the tubes in general. Furthermore, the structure of the heat trap devices or the cold trap device is complex and the furnace system is disposed in complex in using the particle trap device. In accordance with the above description, the methods for preventing the solid phase particles to be formed in the first tube 35 and the second tube 36 is always following the defects which can not be ignored. Relatively, these two improved ways in the embodiment do not need to change the configuration of each tube and to assemble the particles trap device. The tubes are only surrounded using the heat gas. The embodiment is an easier method obviously especially adding the gas cooling cycle in the furnace system.

Furthermore, the embodiment also can use the liquid cooling cycle when the temperature is lower in the process. We just open the gas cooling cycle 321 and close the liquid cooling cycle when the temperature is higher in the process like the process tube 31 proceeding the high temperature process. In other words, referring to the first embodiment, the flange 32 comprises the first liquid cooling cycle (not showing in the diagram). The length between the place of the first liquid cooling cycle and the center of the process tube 31 is shorter than the length between the place of the gas cooling cycle 321 and the center of the process tube 31. The flange 32 comprises the second liquid cooling cycle (not showing in the diagram). The length between the place of the second liquid cooling cycle and the center of the process tube 31 is longer than the length between the place of the first liquid cooling cycle and the center of the process tube 31. At this time, the first liquid cooling cycle is always opened, and the second liquid cooling cycle is opened until the temperature inside the process tube 31 to be higher than the critical temperature. The gas cooling cycle 321 is still closed until the temperature inside the process tube 31 to be higher than the critical temperature. The critical temperature means that when the temperature inside the process tube 31 is lower than the critical temperature, the by-product which is formed by using the reaction gas in the semiconductor process deposits in the process tube 31 to become the solid phase particles. For example, when $NH_3$ is made to react with $SiCl_2H_2$ to deposit the silicon nitride by using the low pressure vapor chemical deposition (LPVCD) method in the semiconductor process, the critical temperature is about 150° C. If the temperature at the place near the cooling system is lower than the critical temperature, the solid phase particles will be formed at the place near the cooling system to affect the qualities of the wafers which are proceeding the process.

When the traditional cooling system is used, the end O-ring and the flange O-ring must be changed after about two times processes to ensure inside the process tube to be a airtight space. After the furnace process we must clean the door to clean the particles and ensure inside the process tube to be a clean space to raise the qualities of the products. If the present invention is used in the multi-cycle cooling system, the end O-ring and the flange O-ring just must be changed after about six times processes to ensure inside the process tube to be a airtight space. After the furnace process, it is not necessary to clean the door to clean the particles. This shows that the multi-cycle cooling system can raise the efficiency of the proceeding process, decrease the bad rate of the products, and decrease the cost of the production.

In accordance with the present invention, the present invention provides a multi-cycle cooling system in the flange and the door. When inside the process tube not proceeds the high temperature process, we use the first liquid cooling cycle and the second liquid cooling cycle to decrease the temperature at the place near the end O-ring and the flange O-ring. When inside the process tube proceeds the high temperature process and the reaction gas is transmitted to inside the process tube, the first gas cooling cycle, the second gas cooling cycle, and the second liquid cooling cycle to are used to decrease the temperature at the place near the end O-ring and the flange O-ring. The present invention can ensure the well functions in the end O-ring and the flange O-ring to make inside the process tube to be a airtight space and not to be damaged in the over high temperature environment. The present invention can also decrease the probability of forming the solid phase by-products at the place near the end O-ring and the flange O-ring because of the over low temperature. The condition can avoid the solid phase by-products particles to deposit on the surface of the wafers, which are proceeding the process, to increase the qualities of the wafers. The multi-cycle cooling system can also increase the cycle time of the process, decrease the times in cleaning the furnace, raise the efficiency of the proceeding process, and decrease the cost of the production.

Although specific embodiments have been illustrated and described, it will be obvious to those skilled in the art that various modifications may be made without departing from what is intended to be limited solely by the appended claims.

What is claimed is:

1. A cooling system of a process tube, said cooling system comprising:
   a first gas cooling cycle located in a door, said first gas cooling cycle being activated when said process tube is operating at a temperature greater than a predetermined value
   a second gas cooling cycle located in a first flange that is coupled to an end of said process tube near said door, wherein said second gas cooling cycle is activated when said process tube is operating at said temperature greater than said predetermined;
   a first liquid cooling cycle located in said first flange, said first liquid cooling cycle being activated when said process tube is operating at a temperature less than said predetermined value; and
   a second liquid cooling cycle located in a second flange that is coupled to said process tube, wherein said second liquid cooling cycle is unconnected with said first liquid cooling cycle, and said second liquid cooling cycle is activated when the process tube is under operation.

2. The cooling system according to claim 1, further comprising an end O-ring, coupled to said process tube, for preventing leak from/to said process tube.

3. The cooling system according to claim 2, wherein said end O-ring is tightly secured between said door and said first flange.

4. The cooling system according to claim 2, further comprising at least a heat sink, said heat sink being configured to dissipate heat from said door prevent damage of said end O-ring.

5. The cooling system according to claim 2, wherein said door has at least a heat insulated slot for blocking heat conduction to said end O-ring, thereby preventing damage of said end O-ring.

6. The cooling system according to claim 1, further comprising a flange O-ring, which is used for preventing inside said process tube to be polluted when said first flange and said second flange are combined.

7. The cooling system according to claim 1, wherein a gas flowing in said first gas cooling cycle is a high pressure air.

8. The cooling system according to claim 1, wherein a gas flowing in said first gas cooling cycle is a cool dry air.

9. The cooling system according to claim 1, wherein a gas flowing in said second gas cooling cycle is a high pressure air.

10. The cooling system according to claim 1, wherein a gas flowing in said second gas cooling cycle is nitrogen.

11. The cooling system according to claim 1, wherein a gas flowing in said second gas cooling cycle is a insert gas.

12. The cooling system according to claim 1, wherein a liquid flowing in said first liquid cooling cycle is freon.

13. The cooling system according to claim 1, wherein a liquid flowing in said first liquid cooling cycle is water.

14. The cooling system according to claim 1, wherein a liquid flowing in said second liquid cooling cycle is freon.

15. The cooling system according to claim 1, wherein a liquid flowing in said second liquid cooling cycle is water.

16. The cooling system according to claim 1, wherein said predetermined value is about than 800° C.

17. A multi-cooling system for cooling a furnace, said multicooling system comprises:
- a first liquid cooling cycle located on a process tube to cool a first element on said process tube and extend the lifetime of said first element;
- a second liquid cooling cycle located in a door to cool a second element on said process tube and extend the lifetime of said second element;
- a first gas cooling cycle located on said process tube to cool said first element on said process tube and to avoid a solid phase by-product to be produced at a place near said first element when a temperature is less than a predetermined value; and
- a second gas cooling cycle located in said door to cool said second element on said process tube and to avoid a solid phase by-product to be produced at a place near said second element when said temperature is less than said predetermined value.

18. The multi-cycle cooling system according to claim 17, wherein said first element comprises a flange O-ring.

19. The multi-cycle cooling system according to claim 17, wherein said second element comprises a end O-ring.

20. The multi-cycle cooling system according to claim 19, wherein said end O-ring is located between said door and said process tube to seal the crevice between said door and said process tube when said door and said process tube are combined..

21. The multi-cycle cooling system according to claim 17, wherein said process tube comprises a flange to combine said door and said process tube.

22. The multi-cycle cooling system according to claim 17, wherein said door comprises a plurality of heat sinks, said heat sinks being used to radiate heat for protecting said second element.

23. The multi-cycle cooling system according to claim 17, wherein said door comprises a heat insulated slot for increasing lifetime of said end O-ring by reducing amount of heat that conducts to said second element.

24. The multi-cycle cooling system according to claim 17, wherein the gas flowing in said second gas cooling cycle is a high pressure air.

25. The multi-cycle cooling system according to claim 17, wherein the gas flowing in said second gas cooling cycle is a cool dry air.

26. The multi-cycle cooling system according to claim 17, wherein the gas flowing in said first gas cooling cycle is a high pressure air.

27. The multi-cycle cooling system according to claim 17, wherein the gas flowing in said first gas cooling cycle is nitrogen.

28. The multi-cycle cooling system according to claim 17, wherein the gas flowing in said first gas cooling cycle is a insert gas.

29. The multi-cycle cooling system according to claim 17, wherein the liquid flowing in said first liquid cooling cycle is freon.

30. The multi-cycle cooling system according to claim 17, wherein the liquid flowing in said first liquid cooling cycle is water.

31. The multi-cycle cooling system according to claim 17, wherein the liquid flowing in said second liquid cooling cycle is freon.

32. The multi-cycle cooling system according to claim 17, wherein the liquid flowing in said second liquid cooling cycle is water.

33. The multi-cycle cooling system according to claim 17 wherein said predetermined value is about 800° C.

* * * * *